United States Patent
Paulsen et al.

(10) Patent No.: US 7,482,251 B1
(45) Date of Patent: Jan. 27, 2009

(54) ETCH BEFORE GRIND FOR SEMICONDUCTOR DIE SINGULATION

(75) Inventors: Ronald E Paulsen, Woodinville, WA (US); Ronald L. Koepp, Seattle, WA (US); Yanjun Ma, Bellevue, WA (US); Larry Morrell, Kirkland, WA (US); Andrew E. Horch, Seattle, WA (US)

(73) Assignee: Impinj, Inc., Seattle, WA (US)

( * ) Notice: Subject to any disclaimer, the term of this patent is extended or adjusted under 35 U.S.C. 154(b) by 0 days.

(21) Appl. No.: 11/891,392

(22) Filed: Aug. 9, 2007

Related U.S. Application Data (60) Provisional application No. 60/838,496, filed on Aug. 16, 2006, provisional application No. 60/837,179, filed on Aug. 10, 2006.

(51) Int. Cl.
*H01L 21/00* (2006.01)
*H01L 21/44* (2006.01)

(52) U.S. Cl. .............. 438/460; 438/108; 438/114; 438/461; 438/464; 438/465; 257/E21.237; 257/E21.238; 257/E21.502; 257/E21.503; 257/E21.599

(58) Field of Classification Search .............. 438/108, 438/114, 460–465, 703, 736; 257/E21.237, 257/E21.238, E21.502, E21.503, E21.599
See application file for complete search history.

(56) References Cited

U.S. PATENT DOCUMENTS

| | | | | |
|---|---|---|---|---|
| 6,337,258 B1 * | 1/2002 | Nakayoshi et al. | .......... | 438/464 |
| 6,344,401 B1 * | 2/2002 | Lam | .......... | 438/460 |
| 6,388,334 B1 * | 5/2002 | Birdsley | .......... | 257/778 |
| 6,399,463 B1 * | 6/2002 | Glenn et al. | .......... | 438/463 |
| 6,573,156 B1 * | 6/2003 | Wang et al. | .......... | 438/460 |
| 6,649,445 B1 * | 11/2003 | Qi et al. | .......... | 438/108 |
| 6,858,471 B1 * | 2/2005 | Korec et al. | .......... | 438/113 |
| 6,867,489 B1 * | 3/2005 | Estacio | .......... | 257/692 |
| 7,052,977 B1 * | 5/2006 | Yegnashankaran et al. | .. | 438/460 |
| 7,129,114 B2 * | 10/2006 | Akram | .......... | 438/110 |
| 7,179,722 B2 * | 2/2007 | Murata et al. | .......... | 438/460 |
| 2004/0121563 A1 * | 6/2004 | Farnworth et al. | .......... | 438/465 |
| 2004/0198024 A1 * | 10/2004 | Yoon et al. | .......... | 438/463 |

* cited by examiner

*Primary Examiner*—Michael S Lebentritt
(74) *Attorney, Agent, or Firm*—Blakely, Sokoloff, Taylor & Zafman, LLP

(57) ABSTRACT

Methods are provided, and devices made by such methods. One of the methods includes procuring a semiconductor wafer, processing the wafer to form a plurality of circuits on a top side, forming trenches on the top side between the adjacent circuits, forming a trench passivation layer on side walls of the trenches, forming conductive bumps on the top side of the wafer; and removing material from the bottom side to thin the wafer, and eventually separate the wafer along the trenches into dies, where each die includes only one of the circuits.

42 Claims, 7 Drawing Sheets

EMBODIMENT

FIG. 2   *METHOD*

FIG. 3A  SILICON WAFER

FIG. 3B  WAFER WITH FORMED CIRCUITS

FIG. 3C  WAFER WITH FORMED TRENCHES

FIG. 3D  WAFER SINGULATED INTO DIES

FIG. 3E

FIG. 4A  *FORMING TRENCHES*

FIG. 4B  *DRY ETCHING*

FIG. 4C  *WET ETCHING*

FIG. 5  *FORMING TRENCHES*

630 FORM TRENCHES BY LASER DRILLING

FIG. 6  *FORMING TRENCHES*

FIG. 7  *FORMING PASSIVATION LAYER*

*BUMPING TOP SURFACE OF WAFER*

FIG. 8

ETCH BEFORE GRIND FOR SEMICONDUCTOR DIE SINGULATION

CROSS REFERENCE TO RELATED APPLICATIONS

This application claims priority from U.S.A. Provisional Application No. 60/837,179, filed on Aug. 10, 2006, the disclosure of which is hereby incorporated by reference for all purposes.

This application claims priority from U.S.A. Provisional Application No. 60/838,496, filed on Aug. 16, 2006, the disclosure of which is hereby incorporated by reference for all purposes.

BACKGROUND

1. Field of the Invention

The present invention is related to the field of semiconductor wafer processing, and more specifically to methods for cost effective singulation of integrated circuit dies from a semiconductor substrate, and devices made according to such methods.

2. Description of the Related Art

Semiconductor processing generally comprises multiple photolithographic, etching, plating and doping operations to form an array of individual integrated circuit dies on the surface of a semiconductor substrate, such as a wafer. For application of Radio Frequency Identification (RFID) tag chips, integrated circuit die densities frequently range in the tens of thousands of dies per wafer. Each die is separated from the others by a narrow inactive boundary referred to as a die "street". Once integrated circuit die fabrication and testing at the wafer level are completed, the individual die is "singulated". Singulation is typically accomplished by cutting along the die streets using a sawing process. With current practice, width of the street is about 60 microns. If the active area on a die is 250,000 square microns (500 microns on each side), then the total area of the die, including the 60 micron wide street around each die is 313,600 square microns. If a narrower, 20 micron wide street is used around the die, then the total die area becomes 270,400 square microns. The difference between a 60 micron wide street and a 20 micron wide street provides approximately 16% more dies per wafer. As die sizes decrease, it is imperative to reduce the width of die streets.

Current techniques involve thinning the wafer prior to sawing through the wafer, to complete the singulation.

What is needed is a method for die singulation which overcomes these limitations of the prior art.

BRIEF SUMMARY

The disclosure provides methods for die singulation on wafers, and devices made by such methods. One of the methods includes a number of operations, which can be performed in various orders. These operations include procuring a semiconductor wafer, processing the wafer to form a plurality of circuits on a top side, forming trenches on the top side between the adjacent circuits, optionally forming a trench passivation layer on side walls of the trenches, forming conductive bumps on the top side of the wafer; and removing material from the bottom side to thin the wafer, and eventually separate the wafer along the trenches into dies, where each die includes only one of the circuits.

The invention offers significant cost advantages over the prior art, by changing the order of the process operations by moving the wafer thinning operation, and optionally also the bump formation, after the trench forming operation and replacing the traditional sawing technique with more cost effective etching or laser scribing processes.

These and other features and advantages of the invention will be better understood from the specification of the invention, which includes the following Detailed Description and accompanying Drawings.

BRIEF DESCRIPTION OF THE DRAWINGS

The present invention is illustrated by way of example and not limitation in the figures of the accompanying drawings, in which like references indicate similar elements and in which:

FIGS. 1A-C are snapshots of operations in methods for preparing integrated circuit chips from a silicon wafer according to embodiments, in which

FIGS. 3A-D show cross-sections of the silicon wafer at selected process operations in the methods to prepare integrated circuit chips from wafer according to embodiments, in which

DETAILED DESCRIPTION

The present invention is now described. While it is disclosed in its preferred form, the specific embodiments of the invention as disclosed herein and illustrated in the drawings are not to be considered in a limiting sense. Rather, these embodiments are provided so that this disclosure will be thorough and complete, and will fully convey the scope of the invention to those skilled in the art. Indeed, it should be readily apparent in view of the present description that the invention may be modified in numerous ways. Among other things, the present invention may be embodied as methods, devices, and so on. This description is, therefore, not to be taken in a limiting sense.

Integrated circuits are made according to embodiments, using semiconductor fabrication methods. A very high level overview is now provided.

Figure 1A:
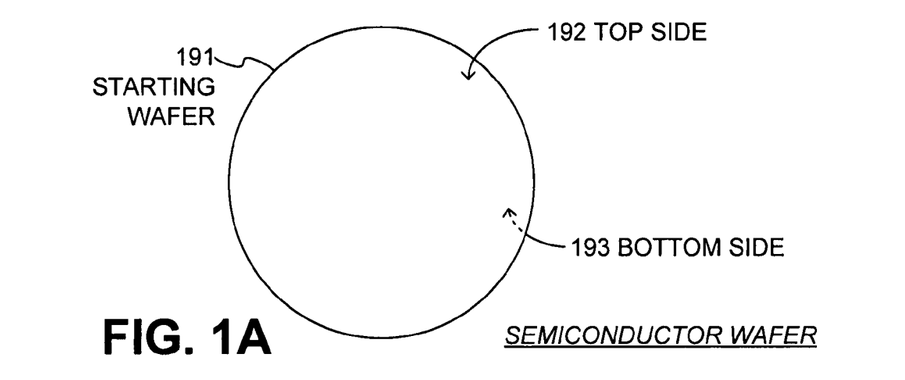
FIG. 1A shows a starting wafer.

FIG. 1A shows a starting wafer 191. Wafer 191 is typically of semiconductor material, such as silicon. The silicon is sometimes doped with p-type or n-type impurities, to improve its electronic properties, as desired for it to operate as a substrate. Wafer 191 has a top side 192 and a bottom side 193 opposite top side 192. Typically circuits are formed on top side 192, as described below.

Figure 1B:
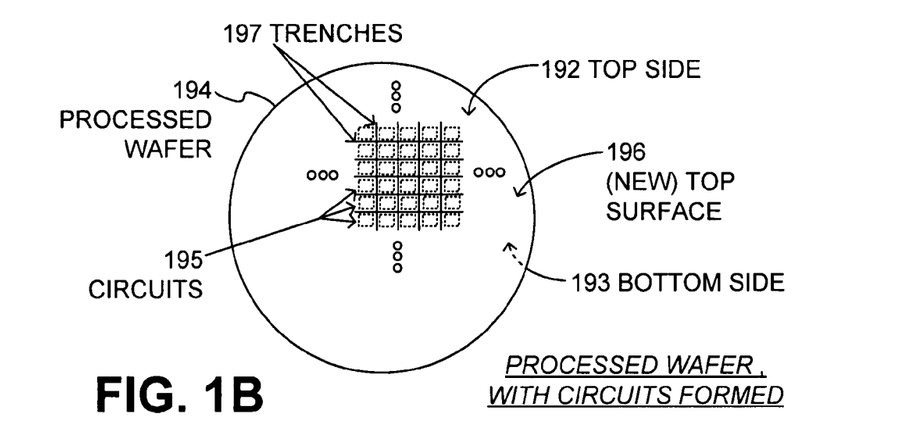
FIG. 1B shows a wafer which is derived from the wafer shown in FIG. 1A.

FIG. 1B shows a processed wafer 194, which has been derived from wafer 191 after circuits 195 have been formed according to embodiments. Only a few such circuits 195 are shown in FIG. 1B, but that is only by way of illustration. In actual practice, as many as possible such circuits 195 are formed on wafer 191, to increase yield per wafer, and thus reduce the cost of each resulting unit.

Circuits 195 are formed by semiconductor manufacturing machines, often operated by foundries. It is worthwhile to note that circuits 194 are formed at the original surface of top side 192, both beneath the level of the original surface and above it. In addition, other materials are then deposited on top side 192. Some of these other materials can be called, for purposes of this disclosure, circuit passivation layer(s). Accordingly, wafer 194 acquires a new top surface 196, which is elevated compared to the original surface.

Figure 1C:
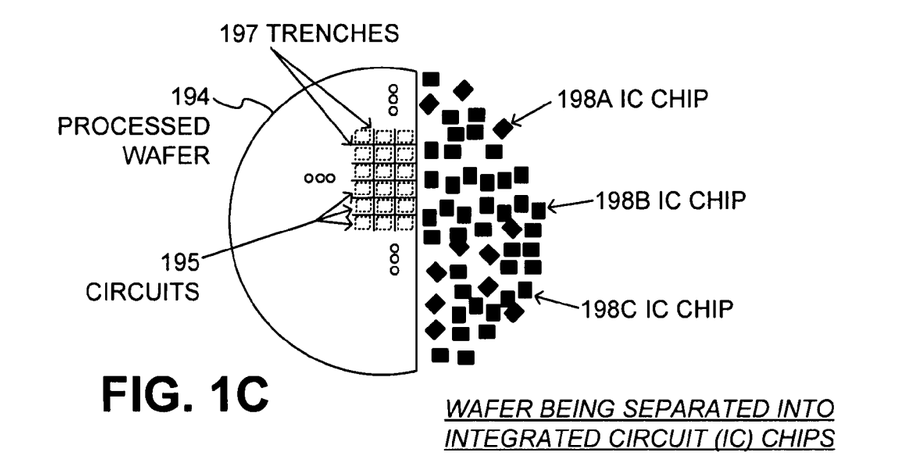
FIG. 1C shows the wafer of FIG. 1B after it is singulated into dies according to an embodiment of the present disclosure.

FIG. 1C shows that wafer 194 of FIG. 1B is afterwards separated into individual chips 198A, 198B, 198C, etc., according to embodiments. This separating is also called singulating. Singulation can be performed by dicing processed wafer 194. Each of individual chips 198A, 198B, 198C, typically contains one of circuits 195, and is thus called an integrated circuit (IC) chip. The size of each IC chip is thus determined in part by the size of circuit 195.

Figure 2:
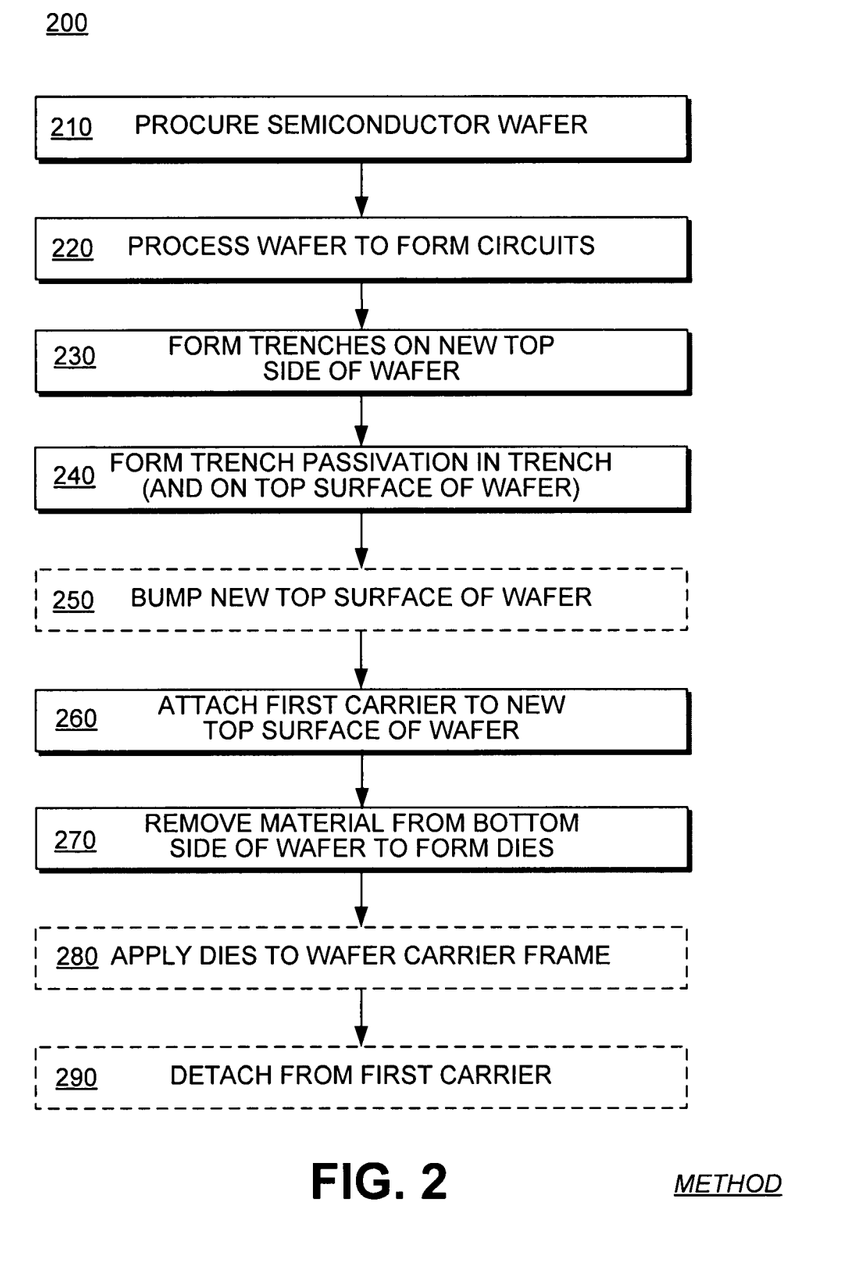
FIG. 2 is a flowchart illustrating a method for die singulation according to an embodiment of the present disclosure.

FIG. 2 illustrates flowchart 200 for describing die singulation methods according to embodiments of the present disclosure. As will be appreciated, these methods are for forming singulation trenches around the circuits on the top side of the wafer using a batch process for example like a "plasma etch", or a laser scribing process prior to thinning the wafer. FIG. 2 will be described in association with relevant drawings FIGS. 3A, 3B, 3C and 3D.

Figures 3A, 3B:
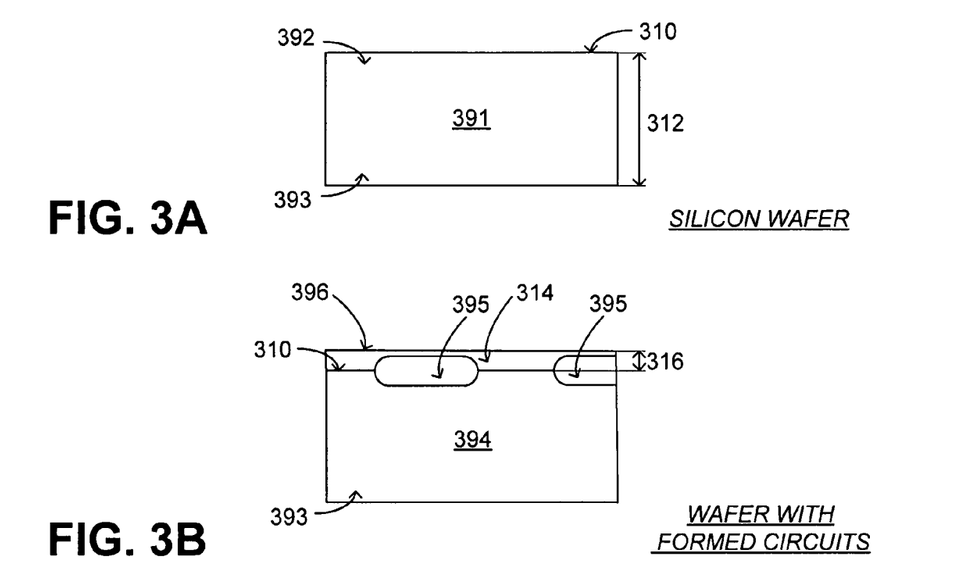
FIG. 3A shows the cross-section of the starting wafer.
FIG. 3B shows the cross-section of the wafer with circuits formed.

Flowchart 200 starts in operation 210, which is described also with reference to FIG. 3A. A starting semiconductor wafer 391, as shown in FIG. 3A, is procured. Semiconductor wafer 391 has a top side 392 and a bottom side 393, and is similar to wafer 191. Typically semiconductor wafer 391 has a thickness 312 about 750 microns.

A next operation 220 is described also with reference to FIG. 3B. Circuits 395 are formed on the original surface of top side 392, both beneath the level of the original surface 310 and above it. In addition, other materials are also deposited on top side 392, for example gate stacks for CMOS devices, interconnect layers (metal wires), devices above the silicon surface such as MIM (metal-insulator-metal) capacitors and a circuit passivation layer 314, which is sometimes also called a dielectric, and many others are possible. Accordingly, processed wafer 394 acquires a new top surface 396, which is elevated compared to the original surface 310. Typically, passivation layer 314 has depth 316 of less than 2 microns.

Figure 3C:
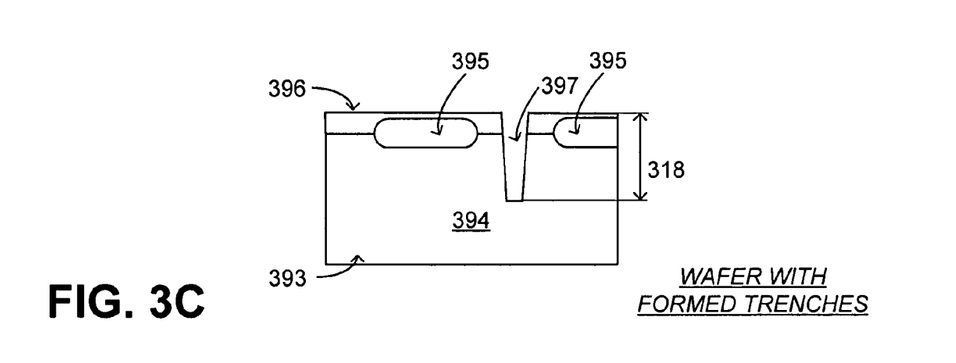
FIG. 3C shows the cross-section of the wafer with formed trenches.

Another operation 230 is described also with reference to FIG. 3C. Trenches 397 are formed on the top side of wafer 392. Trench formation can precede, can occur concurrently, or follow circuit formation. Flowchart 230 illustrates trench formation that follows circuit formation. Trenches 397 are formed along the die "street", a narrow electrically inactive region between adjacent circuits 395, as it is shown in FIG. 3C. Locations of corresponding trenches 197 in relation to the circuits 195 are also shown in FIG. 1B. The size of a trench depends on the specific technology used to form it.

Figure 3D:
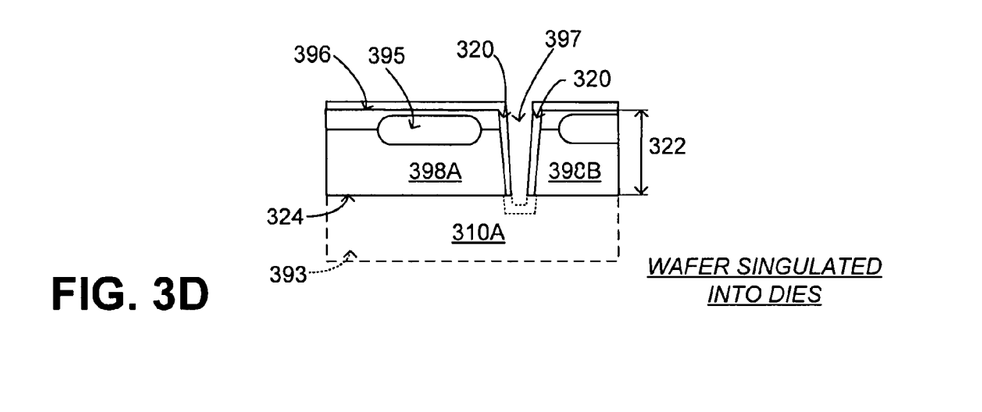
FIG. 3D shows the wafer singulated into dies.

In another operation 240, side walls of trenches 397 are coated with trench passivation layer 320, as also shown in FIG. 3D. In some embodiments, trench passivation layer 320 does not extend to any portion of the top surface that has been created by circuit passivation 314. In others, trench passivation layer 320 is formed to extend over at least a portion of the top surface, for example, to prevent metal layers from forming on the side walls of trench 397 during a bumping process or during an optional MCap (metal capsulation) process.

In another optional operation 250, bumps (not shown in FIG. 3A, 3B, 3C, 3D or 3E) are formed on the top surface of wafer 396. Bumps are formed to provide electrical terminals to the chips for an eventual system assembly process. Bumping process 250 includes operations for defining bump location by using a photolithographic process. Or bumps can be formed by a process such as electroplating in which bumps are formed on exposed metal pads. The exposed metal pad regions are formed previously during a selective passivation etch step. In other embodiment bumping pads are formed on a top of a MCap layer 332, either with a photolithographic step, or with a self-aligned process such as electroplating. There are a number of techniques and materials available for bumping. For example: an electroless Nickel process, a controlled collapse chip connection (C4) process, a Lead/Tin (Pb/Sn) process and a Gold/Tin (Au/Sn) process.

In another operation 260, a first carrier (not shown in FIG. 3A, 3B, 3C, 3D or 3E) is attached to the new top surface of wafer 396. The first carrier typically is an UV transparent plate, while the adhesive for the attachment is an UV sensitive material that loses it adhesiveness once it is exposed to UV light. The first carrier provides support for wafer 394 during subsequent processing operations. The first carrier can also be a tape.

Another operation 270 is described also with reference to FIG. 3D. Wafer 394 is thinned by removing material 310A from the bottom side of wafer 393, and new bottom surface 324 is formed. The method for removing material from the bottom of wafer may include a grinding process, a Chemical Mechanical Polish (CMP) process or an etching process.

In some embodiments, material is removed from the bottom of the wafer until a bottom of the trench is reached. In other embodiments, removing material from the bottom of wafer is stopped before a bottom of the trench is reached. Once enough material is removed form wafer 394 to expose trenches 397 on the backside as shown in FIG. 3D, dies 398A and 398B are practically separated, except for being held together by the adhesive on the carrier. The eventual die thickness 322 is a function of the of the trench depth 318 which in turn is the function of the trench forming process. Typical thickness is between 50 and 150 and no case it is less than 30 microns. In other embodiments, not enough material is removed to reach the bottom of the trenches.

In operation 280, a wafer carrier frame (not shown in FIG. 3A, 3B, 3C, 3D or 3E) is attached to the new bottom surface 324. The wafer carrier provides support for the singulated dies during electrical test and visual inspection.

In operation 290, dies are detached from the first carrier exposing singulated dies and by doing so allowing access to individual dies to be electrically tested and inspected.

Figure 3E:
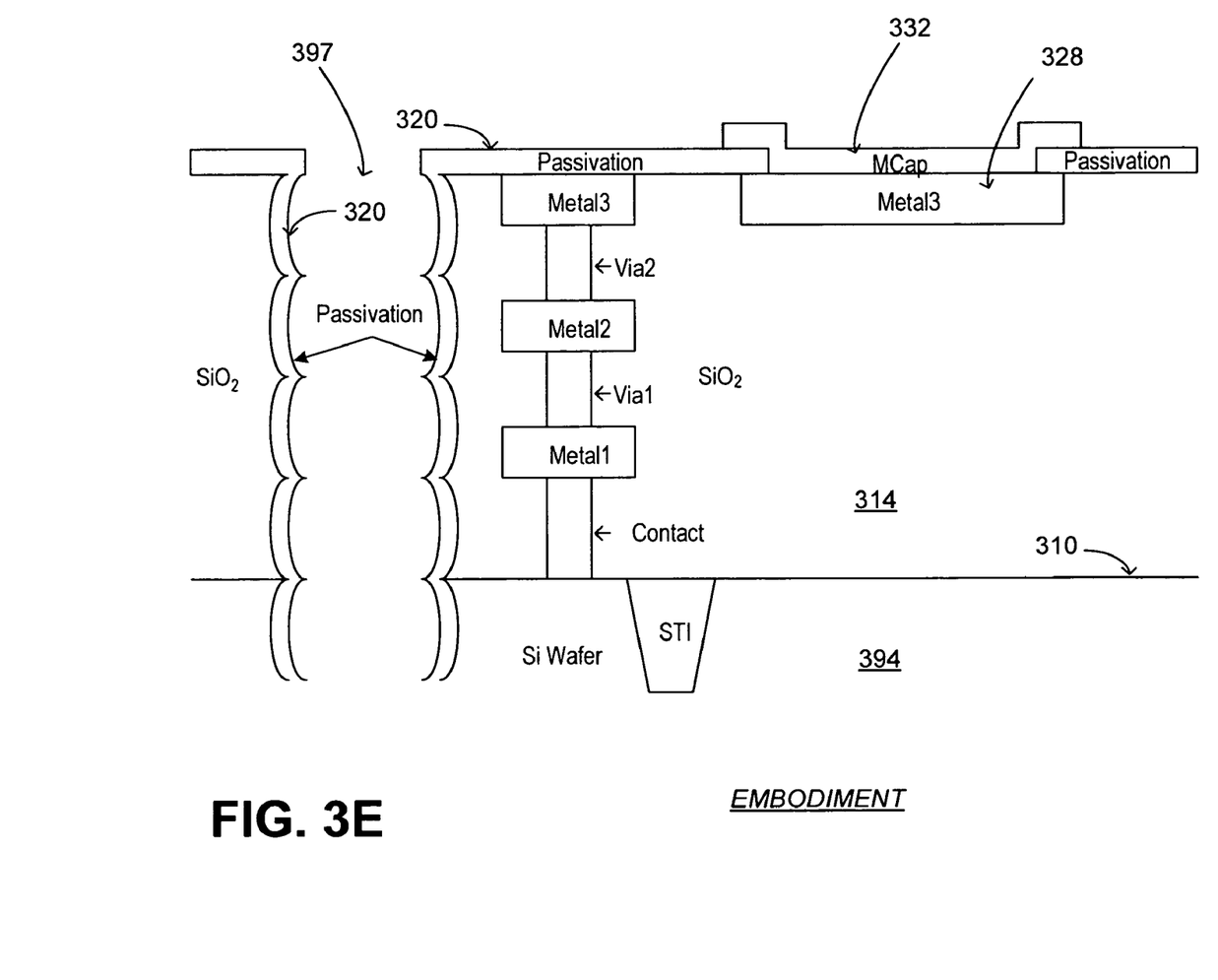
FIG. 3E is a section diagram of a wafer according to an embodiment when a trench passivation also extends to a top surface of a processed wafer.

FIG. 3E is a section diagram of a wafer according to an embodiment with wafer 397, and other features numbered similarly as above. A trench passivation 320 also extends to a top surface of a processed wafer. An opening can be made for a Metal3 328, which is a pad. That can be capped by a suitable conductor 332, such as Aluminum.

Figure 4A:
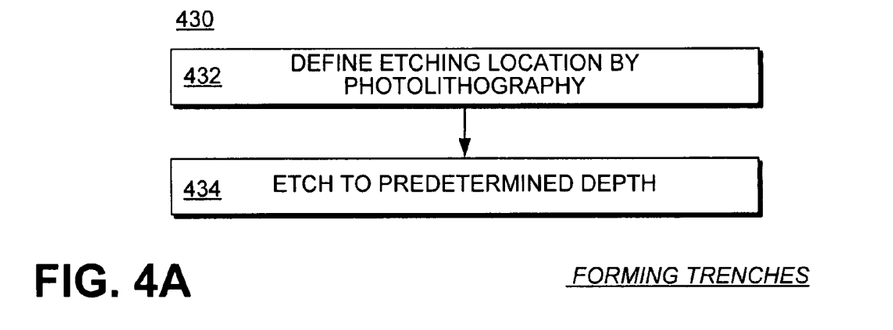
FIG. 4A is a flowchart illustrating a method for forming trenches according to an embodiment of an operation of the method of FIG. 2.
Figure 5:
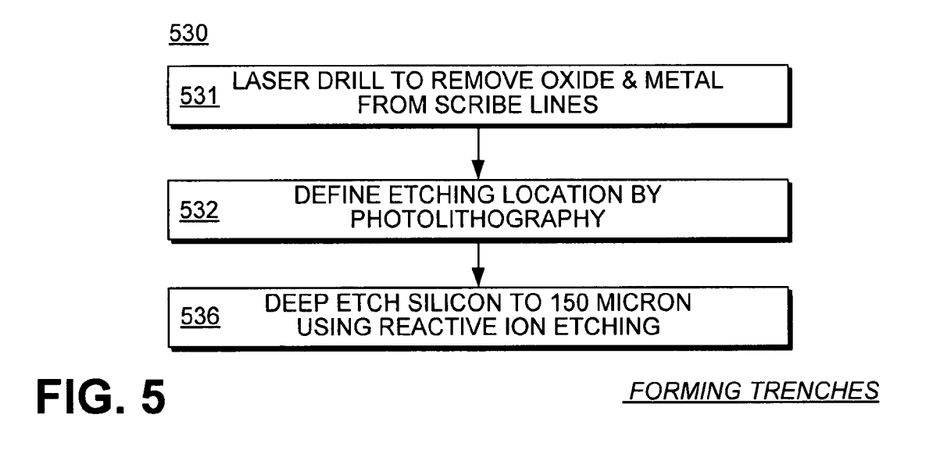
FIG. 5 is a flowchart illustrating a method for forming trenches according to an embodiment of an operation of the method of FIG. 2.
Figure 6:
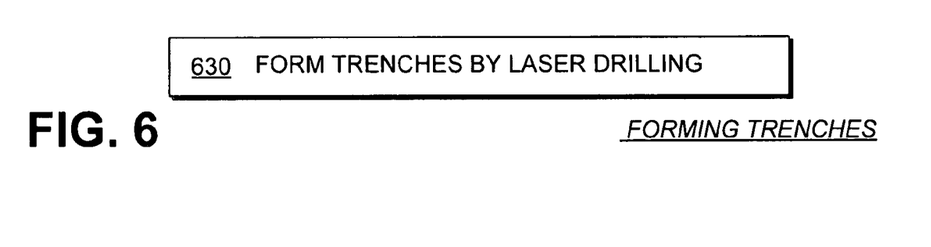
FIG. 6 is a flowchart illustrating a method for forming trenches according to an embodiment of an operation of the method of FIG. 2.

FIG. 4A, FIG. 5 and FIG. 6 show flowcharts for illustrating various embodiments of trench forming methods as part of a die singulation operation of flowchart 200.

FIG. 4A illustrates trench forming method 430 according to an embodiment of the present disclosure. Method 430 forms trenches between adjacent circuits by using etching processes.

In operation 432, etching locations are defined using conventional photolithographic techniques.

In operation 434, etching is performed until a predetermined trench depth 318 in FIG. 3C is reached. Trench depth 318 is between 35-165 microns. Preferably it is 55 microns.

Figure 4B:
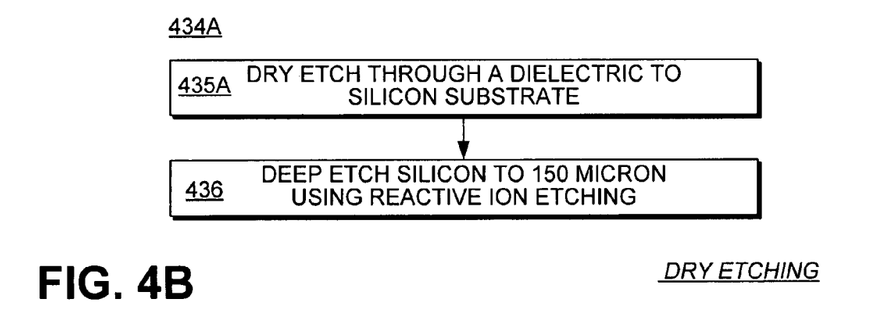
FIG. 4B is a flowchart illustrating a method for etching trenches according to an embodiment of an operation of the method of FIG. 4A.

FIG. 4B illustrates a flowchart 434A for a trench etching method according to an embodiment of the present disclosure. The method of flowchart 434A etches trench 397 in two operations, operation 435A followed by operation 436.

In operation 435A, a dry etching operation etches through protective dielectric layer 314 to silicon substrate 394. The depth of this etching operation 316 is typically less than 2 microns.

In operation 436, a deep etch of silicon is performed, using a reactive ion etching technique. The depth of this etching 318 is typically 150 microns.

Figure 4C:
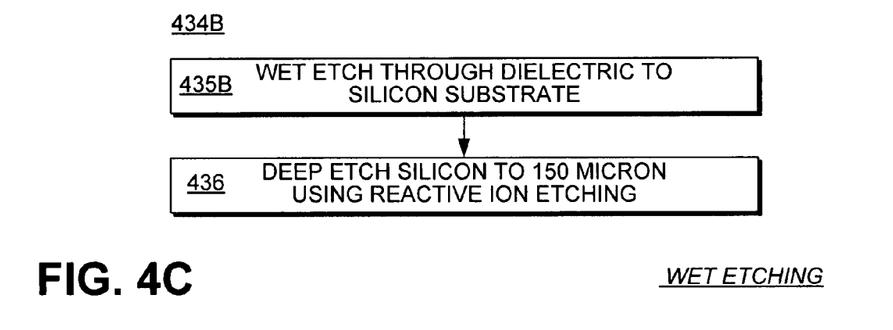
FIG. 4C is a flowchart illustrating a method for etching trenches according to an embodiment of an operation of the method of FIG. 4A.

FIG. 4C illustrates a flowchart 434B for a trench etching method according to another embodiment of the present disclosure. The method of flowchart 434B etches trench 397 in two operations, operation 435B followed by operation 436.

In operation 435A, a wet etching operation etches through protective dielectric layer 314 to silicon substrate 394. The depth of this etching operation 316 is typically less than 2 microns.

FIG. 5 illustrates a flowchart 500 for a trench forming method according to yet another embodiment of the present disclosure. The method of flowchart 530 forms trenches between adjacent circuits by using leaser drilling techniques to remove protective dielectric layer 314 followed by a reactive ion etch to cut into silicon substrate 394.

In operation 531, a laser drilling process cuts through protective dielectric layer 314 to silicon substrate 394. The depth of this etching operation 316 is typically less than 10 microns, and could be as shallow as 2 microns.

In operation 532, etching locations are defined using conventional photolithographic techniques.

In operation 536, a deep etch of silicon is performed, using a reactive ion etching technique. The depth of this etching 318 is typically 150 microns.

FIG. 6 illustrates a flowchart 630 for a trench forming method according to still yet another embodiment of the present disclosure. The method of flowchart 630 forms trenches between adjacent circuits by using a laser drilling technique.

In operation 630, trenched are cut by a laser drill. Trench depth 318 is between 35-65 microns, preferably it is 55 microns.

Figure 7:
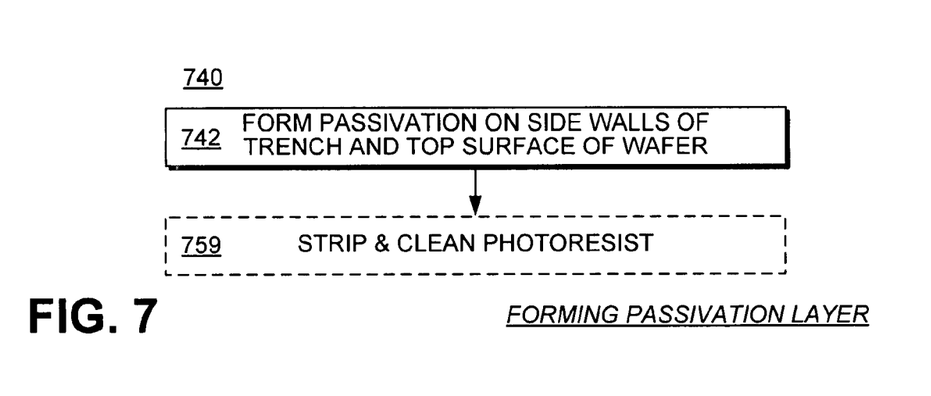
FIG. 7 is a flowchart illustrating a method for forming a passivation layer according to an embodiment of an operation of the method of FIG. 2.

FIG. 7 illustrates a flowchart 740 for a passivation method. Trench passivation layer 320 is formed to prevent metal layers from forming on the side walls of trench 397 during additional wafer processing operations. Optionally trench passivation layer 320 can cover some, or even the entire new top surface of the wafer 396. As such, trench passivation layer 320 then can serve as the passivation layer shown in FIG. 3E layer 320 for a process that has an MCap layer. The applied passivation material is also capable of blocking diffusion of contaminates through the top surface and trench sidewall into the area with circuitry. There are number of materials available this purpose. For example: $Si_3N_4$, $SiO_xN_y$, and some polymers. In other embodiments the passivation layer is only used to prevent bumps from forming on the sidewall. In these embodiments other materials can be used, such as low temperature (LTO) oxide ($SiO_2$), polyimide, a polymer or photoresist.

In operation 742, trench passivation layer 320 is formed. The applied trench passivation layer 320 covers the surface of the side wall of trench 397 and can cover the entire top surface of wafer 396.

In operation 759, photoresist which was used to define the trench location is removed by stripping and cleaning. The stripping process may include either a plasma process or a wet process.

Figure 8:
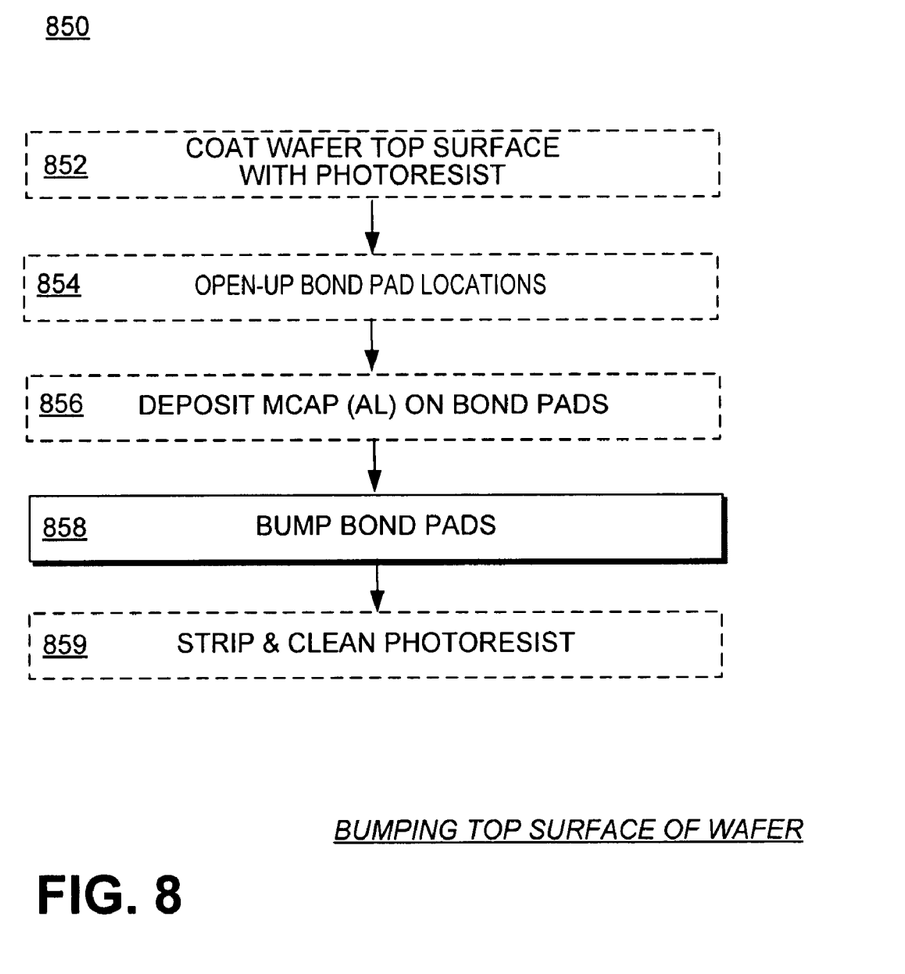
FIG. 8 is a flowchart illustrating a method for bumping a top surface of a wafer according to an embodiment of an operation of the method of FIG. 2.

FIG. 8 illustrates a flowchart 850 for a bumping method. When top surface 396 is covered by trench passivation layer 320, flowchart 850 starts at operation 852, otherwise it starts at operation 858.

In operation 852, top surface of wafer 396 is coated by a photoresist.

In operation 854, bond pad locations are opened-up using photolithography.

In operation 856, in processes that use copper or other materials that easily corrode or oxidize an MCap metal 326 is deposited on bond pads 328 or where ever the sensitive material is exposed, where the deposited MCap metal maybe Aluminum, such as is also seen in FIG. 3E. In one embodiment, not shown in figures, where the deep trench is etched before passivation deposition, the photoresist from the passivation etch step is not fully removed from inside the deep trench. The photoresist is not removed for the deep trench in order to prevent the MCap material from coating the sidewall and bottom of trench, where is may be difficult to remove.

In operation 858 bumps are formed using an electroless Nickel process, or other alternative methods for example a controlled collapse chip connection (C4) process, a Lead/Tin (Pb/Sn) process, or a Gold/Tin (Au/Sn) process.

In operation 859 (an optional operation) photoresist which was left in the deep trench is removed by stripping and cleaning. If the applied photoresist is pliable and does not prevent the easy separation of chips 398X, it maybe left on the wafer.

As it has been mentioned, the present invention provides a cost effective method for die singulation.

Numerous details have been set forth in this description, which is to be taken as a whole, to provide a more thorough understanding of the invention. In other instances, well-known features have not been described in detail, so as to not obscure unnecessarily the invention.

The invention includes combinations and subcombinations of the various elements, features, functions and/or properties disclosed herein. The following claims define certain combinations and subcombinations, which are regarded as novel and non-obvious. Additional claims for other combinations and subcombinations of features, functions, elements and/or properties may be presented in this or a related document.

The claimed invention is:

1. A method comprising:
procuring a semiconductor wafer having a top side and a bottom side opposite to the top side;

processing the wafer to form at least two circuits on the top side;

forming a trench on the top side between the two circuits;

forming a trench passivation layer on side walls of the trench;

forming conductive bumps on the top side; and removing material from the bottom side so as to thin the wafer and eventually separate the wafer along the trench into at least two dies, each die including one of the circuits.

2. The method of claim 1, in which the circuits are formed prior to forming the trench.

3. The method of claim 1, in which the circuits are formed concurrently with forming the trench.

4. The method of claim 1, in which the circuits are formed after forming the trench.

5. The method of claim 1, in which the trench is formed by etching.

6. The method of claim 5, further comprising:
performing photolithography to define an etching location for the trench.

7. The method of claim 5, in which etching includes a wet etching process.

8. The method of claim 5, in which etching includes a dry etching process.

9. The method of claim 5, in which trench forming includes a laser drilling process.

10. The method of claim 1, in which the trench is formed by laser drilling.

11. The method of claim 1, in which trench forming is followed by a reactive ion etching process.

12. The method of claim 1, in which the trench passivation layer includes a $SiO_2$ layer.

13. The method of claim 12, in which the $SiO_2$ layer is formed by a low temperature oxide deposition.

14. The method of claim 1, in which forming the trench passivation layer is followed by stripping and cleaning a photoresist.

15. The method of claim 1, further comprising:
forming a circuit passivation layer on the top side to define a top surface; and
in which the trench passivation layer is formed to also cover at least a portion the top surface.

16. The method of claim 15, in which the trench passivation layer is at least one of a $Si_3N_4$ layer, a $SiO_xN_y$ layer, a polymer layer, a polyimide layer, a $SiO_2$ layer, and a photoresist layer.

17. The method of claim 15, in which
in which the trench passivation layer leaves an opening at a portion the top surface, and
the opening is covered with Aluminum (Al).

18. The method of claim 1, in which
removing material from the bottom of the wafer is performed until a bottom of the trench is reached.

19. The method of claim 1, in which
removing material from the bottom of wafer is stopped before a bottom of the trench is reached.

20. The method of claim 1, in which
removing material from the bottom of the wafer is stopped while a trench depth is still more than 30 microns, measured from the new top surface.

21. The method of claim 1, further comprising:
attaching a top carrier to the wafer for supporting the wafer during removing the material.

22. The method of claim 21, in which
the top carrier includes one of a glass substrate and a tape.

23. The method of claim 21, further comprising:
attaching the dies to a wafer carrier frame after removing the material; and
de-attaching from the top carrier.

24. An Integrated Circuit (IC) chip prepared by a method comprising:
procuring a semiconductor wafer having a top side and a bottom side opposite to the top side;
processing the wafer to form at least two circuits on the top side;
forming a trench on the top side between the two circuits;
forming a trench passivation layer on side walls of the trench;
forming conductive bumps on the top side; and
removing material from the bottom side so as to thin the wafer and eventually separate the wafer along the trench into at least two dies, each die including one of the circuits.

25. The IC chip of claim 24, in which
the circuits are formed prior to forming the trench.

26. The IC chip of claim 24, in which
the circuits are formed concurrently with forming the trench.

27. The IC chip of claim 24, in which
the circuits are formed after forming the trench.

28. The IC chip of claim 24, in which
the trench is formed by etching.

29. The IC chip of claim 28, in which the process further comprises:
performing photolithography to define an etching location for the trench.

30. The IC chip of claim 28, in which
etching includes a wet etching process.

31. The IC chip of claim 28, in which
etching includes a dry etching process.

32. The IC chip of claim 28, in which
trench forming includes a laser drilling process.

33. The IC chip of claim 24, in which
the trench is formed by laser drilling.

34. The IC chip of claim 24, in which
trench forming is followed by a reactive ion etching process.

35. The IC chip of claim 24, in which the process further comprises:
forming a circuit passivation layer on the top side to define a top surface; and
in which the trench passivation layer is formed to also cover at least a portion the top surface.

36. The IC chip of claim 35, in which
the trench passivation layer is one of a $Si_3N_4$ layer, a SiON layer and $SiO_xN_y$ layer.

37. The IC chip of claim 35, in which
in which the trench passivation layer leaves an opening at a portion the top surface, and
the opening is covered with Aluminum (Al).

38. The IC chip of claim 24, in which
removing material from the bottom of the wafer is performed until a bottom of the trench is reached.

39. The IC chip of claim 24, in which
removing material from the bottom of wafer is stopped before a bottom of the trench is reached.

40. The IC chip of claim 24, in which the process further comprises:
attaching a top carrier to the wafer for supporting the wafer during removing the material.

41. The IC chip of claim 40, in which
the top carrier includes one of a glass substrate and a tape.

42. The IC chip of claim 40, in which the process further comprises:

attaching the dies to a wafer carrier frame after removing the material; and de-attaching from the top carrier.

* * * * *

UNITED STATES PATENT AND TRADEMARK OFFICE
CERTIFICATE OF CORRECTION

PATENT NO. : 7,482,251 B1 Page 1 of 1
APPLICATION NO. : 11/891392
DATED : January 27, 2009
INVENTOR(S) : Ronald E. Paulsen

It is certified that error appears in the above-identified patent and that said Letters Patent is hereby corrected as shown below:

1) Please delete "in which" in claim 17, column 7, line 52.

2) Please delete "in which" in claim 37, column 8, line 55.

Signed and Sealed this

Tenth Day of November, 2009

David J. Kappos
*Director of the United States Patent and Trademark Office*